United States Patent [19]

Rana et al.

[11] Patent Number: 4,985,371

[45] Date of Patent: Jan. 15, 1991

[54] PROCESS FOR MAKING INTEGRATED-CIRCUIT DEVICE METALLIZATION

[75] Inventors: Virendra V. S. Rana; Nun-Sian Tsai, both of South Whitehall Township, Lehigh County, Pa.

[73] Assignee: AT&T Bell Laboratories, Murray Hill, N.J.

[21] Appl. No.: 282,808

[22] Filed: Dec. 9, 1988

[51] Int. Cl.$^5$ .......................................... H01L 21/283
[52] U.S. Cl. ..................... 437/189; 437/190; 437/192; 437/193; 437/200; 437/246
[58] Field of Search ............... 437/192, 195, 194, 193, 437/200, 962, 189, 199, 245, 246; 357/67

[56] References Cited

U.S. PATENT DOCUMENTS

| | | | |
|---|---|---|---|
| 3,697,343 | 10/1972 | Cuomo et al. | 437/962 |
| 4,581,627 | 4/1986 | Ueda et al. | 357/67 |
| 4,584,207 | 4/1986 | Wilson | 427/124 |
| 4,630,357 | 12/1986 | Rogers et al. | 437/192 |
| 4,650,696 | 3/1987 | Raby | 427/89 |
| 4,726,983 | 2/1988 | Harada et al. | 428/215 |
| 4,742,014 | 5/1988 | Hooper et al. | 437/192 |
| 4,751,101 | 6/1988 | Joshi | 427/39 |
| 4,796,081 | 1/1989 | Cheung et al. | 357/71 |
| 4,812,419 | 3/1989 | Lee et al. | 437/194 |
| 4,822,749 | 4/1989 | Flanner et al. | 437/200 |
| 4,823,182 | 4/1989 | Okumura | 357/67 |
| 4,845,050 | 7/1989 | Kim et al. | 437/192 |

FOREIGN PATENT DOCUMENTS

| | | | |
|---|---|---|---|
| 0116089 | 10/1978 | Japan | 437/192 |
| 0093255 | 6/1983 | Japan | 437/192 |
| 0287149 | 12/1986 | Japan | 437/192 |

OTHER PUBLICATIONS

Moriya et al., IEEE EDM Technical Digest, 1983, pp. 550–553.
Gardner et al., IEEE Trans. Electron Devices, vol. ED-32, No. 2, Feb. 1985, pp. 174–180.
Shappiro, J. R., *Solid State Technology*, Oct. 1985, pp. 161–165.
Nicolet, M. A., *Thin Solid Films*, 52, 1978, pp. 415–445.
IBM Technical Disclosure Bulletin, vol. 30, No. 7, Dec. 1987, pp. 249–260, "High Conductivity . . .".
R. A. Levy et al., "Characterization of LPCVD Aluminum for VLSI Processing," Journal of the Electrochemical Society: Solid State Science and Technology, vol. 131 (1984), pp. 2175–2182.

Primary Examiner—Brian E. Hearn
Assistant Examiner—T. N. Quach
Attorney, Agent, or Firm—Richard D. Laumann

[57] ABSTRACT

In the manufacture of an integrated-circuit device, periodic interruption of grain growth during chemical vapor deposition of a metal film results in enhanced surface smoothness and ease of patterning. Interruption of grain growth is by deposition of an auxiliary material which, in the interest of high conductivity of the film, may be conductive, may form a conductive compound or alloy, or may be eliminated upon additional metal deposition. When the metal is tungsten, silicon is a preferred grain-growth interrupting material.

25 Claims, 1 Drawing Sheet

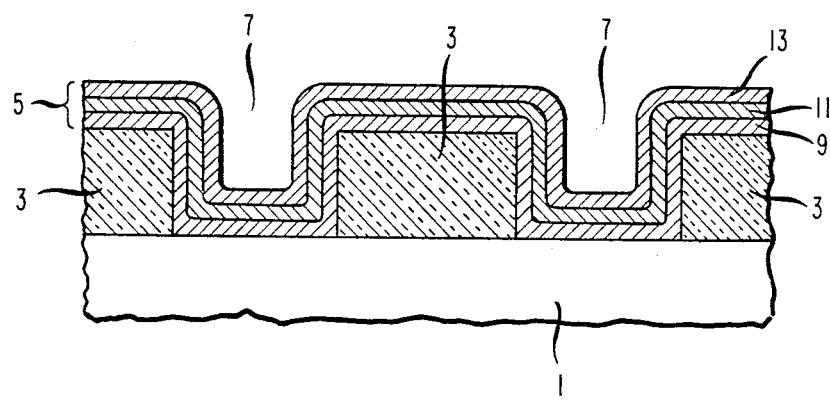

PROCESS FOR MAKING INTEGRATED-CIRCUIT DEVICE METALLIZATION

CROSS-REFERENCE TO RELATED APPLICATION

Concurrently filed is a patent application entitled "Etching of Integrated-Circuit Device Metallization and Resulting Device" and designated as, Ser. No. 07/283,110.

TECHNICAL FIELD

The invention relates to semiconductor integrated-circuit devices comprising a metal layer.

BACKGROUND OF THE INVENTION

In semiconductor integrated-circuit technology, metals are commonly used in the form of patterned layers for establishing electrical connections to and between individual devices such as, e.g., field effect transistors on a silicon chip or substrate; metal may be deposited over a dielectric which previously has been patterned for the sake of access to selected portions of semiconductor material. Typically, a free surface is blanketed with metal, and the deposited metal layer is then patterned to form the desired interconnection configuration. At present, aluminum is the material most widely used for integrated-circuit metallization; however, other refractory metals are receiving attention, and tungsten in particular. Blanket deposition of metal can be carried out, e.g., by (low-pressure) chemical vapor deposition, and patterning by conventional lithographic and plasma- or sputter-etching techniques.

Accurate pattern definition on a surface to be pattern-etched depends on adequate surface smoothness. However, chemical-vapor deposited metal often is found to have a relatively rough surface, surface roughness being attributed to undesirably large grain size in layers having desired thickness. Large grains also inhibit pattern definition in that, when the dimensions of features in a desired pattern become comparable to the grain size, adequate definition becomes difficult, if not impossible. Accordingly, and since preferred film thickness is determined primarily by the requirement that a deposited film have sufficiently high conductivity, it is desirable to deposit relatively thick layers which also have relatively small grain size.

According to one proposed method for producing fine-grained metal deposits, an intended metal layer is provided with grain-growth-interrupting sublayers of a metal compound; see U.S. Pat. No. 4,726,983, issued Feb. 23, 1988 to H. Hirada et al. For example, in the deposition of an aluminum layer by physical sputter deposition, periodic introduction of oxygen leads to the formation of sublayers of aluminum oxide. It is apparent, however, that the presence of compounds such as aluminum oxide, nitride, or carbide in a metallization layer tends to reduce conductivity. Reduced conductivity has also been observed in layers made by a method disclosed in U.S. Pat. No. 4,751,101, issued Jun. 14, 1988 to R. V. Joshi, where tungsten is deposited by silicon reduction of tungsten hexafluoride.

SUMMARY OF THE INVENTION

Semiconductor integrated-circuit devices preferably are fabricated with highly conductive, fine-grain metallizations, typically of refractory metals. Preferably, in accordance with the invention, a metal layer is obtained by interrupting metal deposition, depositing a grain-growth interrupting layer, and resuming deposition of the metal, the material of the grain-growth interrupting layer being chosen to be conductive, to form a conductive intermetallic compound or alloy, or to be essentially eliminated in the course of subsequent metal deposition. Preferred elimination of the grain-growth interrupting layer may result, e.g., due to volatilization at a higher metal deposition temperature, or to the formation of a volatile compound. Chemical vapor deposition is preferred for metallization and grain-growth interrupting materials. In a preferred embodiment, the metal is essentially tungsten, and the grain-growth interrupting layer is essentially amorphous or polycrystalline silicon. Especially in the case of silicon or a silicon compound, deposition may be plasma-assisted.

Preferred devices of the invention comprise a metallization layer having sublayered grain structure in which the interface between sublayers is essentially free of nonconductive matter. As a result, and in combination with sufficiently large grain size, preferred resistivity of the metallization layer is not more than three times, and preferably not more than twice, the resistivity of a comparison layer in which grain growth is not interrupted. Preferred grain size is further limited in the interest of surface smoothness as beneficial for ease of subsequent pattern definition. Boundaries between sublayers are formed by preferred renucleation—as may result also, even without use of a grain-growth interrupting material, by suitable periodic changes in processing conditions such as, e.g., the introduction of a plasma or of suitable radiation, resulting in disturbed grain surface structure.

BRIEF DESCRIPTION OF THE DRAWING

The FIGURE is a schematic representation of a device having a metallization made according to a preferred embodiment of the invention. For the sake of clarity, the elements of the device are not drawn to scale.

DETAILED DESCRIPTION

Shown in the FIGURE are substrate 1, dielectric layer 3, and metallization 5. The term substrate is used here to include all of the material underlying the dielectric layer; thus, e.g., such substrate includes the devices forming the integrated circuit. The dielectric layer 3 has been patterned to form windows 7 which expose related portions of the substrate such as e.g., the source and drain regions of a field effect transistor. (For reasons of clarity neither the elements of the devices nor the individual devices are depicted. The details of such devices are well-known to those skilled in the art and need not be described.)

Metallization 5 has been (blanket-)deposited over the entire substrate, typically by chemical vapor deposition. Metallization 5 comprises a plurality of sublayers 9, 11, and 13 each comprising a plurality of grains; such sublayers may be termed renucleated layers. Three renucleated layers 9, 11, and 13 are depicted for reasons of exposition, and additional such layers may be present to obtain a desired total thickness. Formation of a renucleated layer on a preceding sublayer involves the formation of a grain-growth interrupting layer, followed by metal deposition. Preferred also is deposition of grain-growth interrupting layer material prior to deposition of even the first metallization sublayer, as the presence of such material on a dielectric tends to foster initial nucleation.

One type of preferred grain-growth interrupting layer comprises silicon, and tungsten is typical as metal, though other metals can be used: among typical combinations of metallization and interrupting layer materials are tungsten and silicon, tungsten and copper, aluminum and silicon, aluminum and carbon, and aluminum and copper. Thus, the interrupting layer material may be a metal, and the use of compounds such as, e.g., tungsten silicide is not precluded as interrupting layer materials.

Preferred silicon material may be amorphous or polycrystalline, amorphous material being preferred in the interest of metallization smoothness, reflectivity (e.g., for alignment purposes), and ease of pattern etching. When used with tungsten, preferred thickness of a silicon layer is at least 5 nanometers, as lesser amounts are considered less effective in initiating tungsten renucleation. On the other hand, preferred amounts of silicon are limited in the interest of minimizing the presence of silicon in elemental, nonconductive form in the final structure. In this respect, preferred upper limits on silicon thickness depend on factors such as, e.g., the type of deposition reactor used and the degree of freedom from contaminants; in the case of a hot-wall reactor, preferred silicon-layer thickness is less than 50 nanometers, with a typical thickness of about 15 nanometers.

If a renucleated layer is sufficiently thin, preferred fine grain size is realized. Such grain size preferably is less than the width of a feature to be obtained by patterning after layer deposition; i.e., in the case of a metal runner, less than the width of the runner, or, in the case of a contact window, less than the window size. In the case of tungsten, in the interest of high conductivity, preferred grain size is at least 50 nanometers, and, in the interest of surface smoothness, not more than 200 nanometers. If alternating layers of tungsten and silicon are deposited sufficiently thin, an essentially transparent film is obtained.

Preferably, in the interest of low resistivity, deposited grain-growth interrupting material is conductive, forms a conductive intermetallic compound or alloy with the metallization material, or is essentially eliminated during metal deposition; preferred elimination is to the extent of at least 95 percent of such material. In the case of tungsten on silicon, with silicon thickness not exceeding preferred thickness as indicated above, deposition of a sufficient amount of tungsten will assure that silicon is essentially eliminated upon subsequent tungsten deposition.

Layer deposition may be carried out in standard low-pressure chemical vapor deposition apparatus including a furnace. As metal deposition and deposition of the interrupting layer may be at different temperatures, auxiliary heating means such as an infrared lamp may be used in the interest of more rapid temperature adjustment. Preferably, however, and in the interest of high throughput, deposition of the two types of layers is at essentially the same temperature. In the case of silicon and tungsten a temperature in a preferred range from 400 to 600 degrees C. is suitable in this respect; when silicon deposition is plasma-assisted, deposition temperature for both tungsten and silicon preferably is in a range from 200 to 500 degrees C.

Other than to the production of tungsten and aluminum films, preferred processing in accordance with the invention is applicable to films of materials such as, e.g., titanium, tantalum, cobalt, and molybdenum as used in semiconductor integrated-circuit manufacture, and the use of alloys and of sublayers having different compositions is not precluded. Also, semiconductor devices need not be silicon-based, and preferred processing in accordance with the invention can be applied equally to metallizations in compound-semiconductor devices as based, e.g., on Group III-V and Group II-IV materials.

Further variations are possible such as, e.g., variation of the thickness of the metal layers. For example, first-deposited layers may have a greater or lesser thickness than overlying layers, and still other variations will be apparent to those skilled in the art.

EXAMPLE 1

A silicon layer approximately 15 nanometers thick is deposited at a temperature of approximately 600 degrees C. by thermal decomposition of silane in low-pressure chemical vapor deposition apparatus. The temperature is lowered to 450 degrees C., and approximately 150 nanometers tungsten is deposited by introduction of tungsten hexafluoride and hydrogen which react according to the nominal formula $$WF_6 + 3H_2 \rightarrow W + 6HF.$$

Simultaneously with the hydrogen reaction, tungsten hexafluoride also reacts with deposited silicon according to the nominal formula $$2WF_6 + 3Si \rightarrow 2W + 3SiF_4,$$

resulting in depletion of deposited silicon. This process of silicon deposition followed by tungsten deposition is repeated for a total of 5 sublayers, and the resulting metallization has a resistivity of approximately 9 micro-ohms centimeter. For the sake of comparison, resistivity of a tungsten metallization layer deposited without grain-growth interruption was found to be approximately 8 micro-ohms centimeter.

EXAMPLE 2

A tungsten layer approximately 100 nanometers thick is deposited at a temperature of approximately 550 degrees C. by reacting tungsten hexafluoride with hydrogen according to the nominal formula of Example 1, followed, upon replacing the flows of tungsten hexafluoride and hydrogen with a flow of silane, by deposition of approximately 15 nanometers of silicon at the same temperature. These steps are repeated for a total of 5 sublayers, and the resulting metallization has a resistivity of approximately 10 micro-ohms centimeter.

EXAMPLE 3

Tungsten is deposited as described above in Example 2, except that deposition temperature is approximately 400 degrees C. Also at approximately 400 degrees C., silicon is deposited in a plasma environment. These processing conditions also result in essentially complete elimination of silicon upon subsequent further tungsten deposition.

EXAMPLE 4

Processing is the same as in Example 2, except that 6 tungsten sublayers are deposited, the first 3 such sublayers having a thickness of approximately 50 nanometers, and the final 3 sublayers having a thickness of approximately 100 nanometers. Such deposition is advantageous for filling high-aspect-ratio windows (e.g., 1.5 micrometers deep and 0.75 micrometer wide), the resulting metallization simultaneously being free of voids and having adequate conductivity.

EXAMPLE 5

Low-pressure chemical vapor deposition is used to deposit aluminum as described by R. A. Levy et al., "Characterization of LPCVD Aluminum for VLSI Processing", *Journal of the Electrochemical Society: Solid-State Science and Technology*, Vol. 131 (1984), pp. 2175–2182), with tri-isobutyl aluminum (TIBAL) as a source gas. Deposition temperature is approximately 250 degrees C. Subsequently, at the same temperature, silicon is deposited in a plasma environment, using $SiH_2Cl_2$ as source gas. Deposition of additional aluminum results in a renucleated layer. A final annealing step can be used to foster intermixing of silicon and aluminum.

We claim:

1. A method for making an integrated-circuit device which includes a dielectric, comprising forming a metallization on said dielectric, and forming said metallization comprising the steps of:

depositing a first metal layer, forming on said first metal layer a grain-growth interrupting layer which is selected to cause renucleation of metal upon further metal deposition, and which is selected from the group consisting of conductive materials, materials which form intermetallic compounds with said metal, materials which form conductive alloys with said metal, and materials which are essentially eliminated upon subsequent metal deposition, and depositing a second metal layer on said grain-growth interrupting layer, said second metal layer consisting essentially of the same metal as said first metal layer, second metal layer forming a renucleated metal layer, at least two grain-growth interrupting layers being deposited, whereby the resistivity of said metallization is less than or equal three times the resistivity of a comparison metallization consisting essentially of the same metallization material and having been deposited without grain-growth interruption.

2. The method of claim 1 in which said material is a conductive material.

3. The method of claim 2 in which said material is a metal.

4. The method of claim 1 in which said material forms a conductive intermetallic compound with said metal.

5. The method of claim 1 in which said material forms a conductive alloy with said metal.

6. The method of claim 1 in which said material is essentially eliminated upon subsequent metal deposition.

7. The method of claim 6 in which elimination of said material comprises volatilization of said material.

8. The method of claim 6 in which elimination of said material comprises formation of a volatile compound.

9. The method of claim 6 in which at least 95 percent of deposited grain-growth interrupting layer material is eliminated upon deposition of said second metal layer.

10. The method of claim 1 in which grain-growth interrupting layer material is deposited on said dielectric.

11. The method of claim 1 in which said metallization consists essentially of tungsten.

12. The method of claim 11 in which tungsten deposition involves reacting tungsten hexafluoride with hydrogen.

13. The method of claim 11 in which said metallization has grain size in the range from 50 to 200 nanometers.

14. The method of claim 11 in which said material comprises silicon.

15. The method of claim 14 in which said material comprises amorphous silicon.

16. The method of claim 14 in which said material comprises polycrystalline silicon.

17. The method of claim 14 in which silicon is deposited by low-pressure chemical vapor deposition at a temperature in the range from 400 to 600 degrees C.

18. The method of claim 14 in which silicon is deposited by plasma-assisted low-pressure chemical vapor deposition at a temperature in the range from 200 to 500 degrees C.

19. The method of claim 14 in which said grain-growth interrupting layer has a thickness which is greater than or equal to 5 nanometers.

20. The method of claim 19 in which deposition is in a hot-wall reactor and in which said grain-growth interrupting layer has a thickness which is less than or equal to 50 nanometers.

21. The method of claim 1 in which said metal is essentially tungsten and said material is essentially copper.

22. The method of claim 1 in which said metal is essentially aluminum and said material is essentially silicon.

23. The method of claim 1 in which said metal is essentially aluminum and said material is essentially carbon.

24. The method of claim 1 in which said metal is essentially aluminum and said material is essentially copper.

25. The method of claim 1 in which said dielectric has been patterned to expose selected portions of semiconductor material.

* * * * *